United States Patent
Cooper et al.

[11] 3,942,139
[45] Mar. 2, 1976

[54] BROADBAND MICROWAVE BULK ACOUSTIC DELAY DEVICE

[75] Inventors: Herbert Warren Cooper, Hyattsville, Md.; John deKlerk, Pittsburgh, Pa.

[73] Assignee: Westinghouse Electric Corporation, Pittsburgh, Pa.

[22] Filed: Nov. 8, 1974

[21] Appl. No.: 522,070

[52] U.S. Cl................. 333/30 R; 310/9.5; 310/9.7; 333/72
[51] Int. Cl.². H03H 9/26; H03H 9/30; H01L 41/10
[58] Field of Search ......... 333/30 R, 72; 310/8, 8.1, 310/8.2, 8.3, 8.4, 8.5, 8.6, 9.5, 9.6, 9.7, 9.8

[56] References Cited
UNITED STATES PATENTS

| | | | |
|---|---|---|---|
| 2,398,701 | 4/1946 | Firestone | 310/8.1 X |
| 2,839,731 | 6/1958 | McSkimin | 333/30 R |
| 3,150,275 | 9/1964 | Lucy | 333/30 R X |
| 3,240,962 | 3/1966 | White | 333/30 R X |
| 3,247,473 | 4/1966 | Allen | 333/30 R |
| 3,582,834 | 6/1971 | Evans | 333/30 R |

OTHER PUBLICATIONS
Mason–"Physical Acoustics," I Part A, Academic Press, New York and London, 1964, pp. 491–494.

Primary Examiner—Paul L. Gensler
Assistant Examiner—Marvin Nussbaum
Attorney, Agent, or Firm—R. M. Trepp

[57] ABSTRACT

A thin film piezoelectric transducer generates bulk mode ultrasonic elastic waves which propagate into a transmission medium, such as silicon. The wave is reflected back towards the first transducer by a reflecting surface. A second transducer is located adjacent to the first transducer and receives the acoustic wave from the reflected surface. The path length of the ultrasonic wave from the first transducer to the second transducer is long enough to enable the bulk wave to be in the Fraunhofer field. An acoustic absorbing material, such as indium, may be placed on the reflecting surface and on the surface containing the two transducers in selective areas to reduce undesired reflections. The structure is suitable for use in the microwave region wherein the insertion loss may be relatively constant over a given frequency band.

19 Claims, 15 Drawing Figures

BROADBAND MICROWAVE BULK ACOUSTIC DELAY DEVICE

BACKGROUND OF THE INVENTION

1. Field of the Invention

This invention relates to electroacoustic apparatus, particularly to broadband microwave frequency delay devices.

2. Description of the Prior Art

Broadband microwave delay devices have been implemented with coaxial cable where the length of the cable determined the time delay. Present cables have resulted in about 30 db signal loss at 5.2 gigahertz for a delay of 100 nanoseconds. To obtain a flat frequency response from a cable delay line from 2.6 to 5.2 gigahertz, an attenuating filter must be placed in series with the cable to provide an approximate $1/f$ dependence in attenuation. The attenuating filter provides maximum attenutation at 2.6 gigahertz which diminishes as a function of $1/f$ to a nominal value at 5.2 gigahertz. Consequently, the coaxial cable delay line with the attenuating filter exhibits an insertion loss which is slightly greater than the maximum coaxial cable attenuation at the upper band edge.

Microwave bulk acoustic delay devices have been developed which are narrowband but tunable over a broadband. One narrowband microwave bulk acoustic delay device consists of a resonant cavity with a transducer at one end coupled to an acoustic transmission medium. The cavity can be tuned over a broadband with a tuning stub, but at any one time, the resonant cavity is tuned to a narrow band. Another implementation of a narrowband microwave bulk acoustic delay device has been made by using a transmission line to connect to a thin film transducer attached to a transmission medium. Because of the low impedance of the thin film transducers, a lumped inductor was placed adjacent to the transducer to increase the impedance to that of the transmission line. The lumped inductor impedance changes with frequency and the impedance characteristics limited the delay device to use over a narrow band.

A further problem with microwave bulk acoustic delay devices is that the acoustic propagation loss is proportional to the frequency squared, and therefore, over a broad band the frequency response due to propagation loss is not constant.

Microwave bulk acoustic delay devices are required to exhibit good electrical isolation between the input and the output. Electromagnetic coupling between the input and output transducers of a delay device or between the input and output connectors to the microwave delay device is the principal cause for loss of isolation.

In some acoustic delay devices, the acoustic signal received at the second transducer is also reflected back into the acoustic transmission medium, and subsequent reflections of this acoustic signal are returned back to the output transducer causing unwanted output signals. One example of unwanted output signals which occur when the transducers are at either end of the transmission medium path is called the triple transit signal. In this case, the signal is reflected from the second transducer to the first transducer and then back to the second transducer. In a typical microwave delay device, the triple transit energy is desired to be down approximately 40 db from the first single transit energy. In some microwave delay devices, because of the high triple transit energy, the insertion loss is intentionally increased or additional gating is providing to further attenuate the triple transit signal and subsequent reflected signals.

SUMMARY OF THE INVENTION

Electroacoustic apparatus in the form of a broadband microwave bulk acoustic delay device is formed by placing a first and second transducer on an ultrasonic transmission medium. The first and second transducers are adapted to convert microwave energy into bulk mode ultrasonic elastic wave energy, and vice versa. The ultrasonic transmission medium includes a first and second surface, with the first and second transducers being located on a flat surface thereof. The first transducer emits bulk mode ultrasonic elastic wave energy into the ultrasonic transmission media, and a second surface of the ultrasonic transmission medium is positioned to reflect the ultrasonic elastic wave incident upon said second surface. The second transducer is located within the area incident of a first reflected ultrasonic elastic wave from the second surface. The first reflected ultrasonic elastic wave incident upon the first surface is spread over a larger area than the area of the initially propagated ultrasonic elastic wave due to propagation in the Fraunhofer field region.

The throughput isolation may be very high by providing a microwave input and output means in the form of a coplanar transmission line, which is of the characteristic impedance of the transducer. Acoustic reflections other than the first reflected wave, such as a double transit reflection, may be attenuated by providing acoustic absorbing material on the first and second surfaces of the transmission medium in selected areas. The electrode dimensions of the first transducer may be adjusted in size to provide the acoustic wave with a predetermined diffraction loss or Fraunhofer field loss at the second transducer. The Fraunhofer field loss and propagation loss may be chosen to provide a flat frequency response over a broad band. A flat response is obtained when the Fraunhofer field loss desired at the highest frequency is adjusted to equal the acoustic signal propagation loss at the lowest frequency of the broadband. The broadband must be within the pass band of the transducers. The insertion loss of the broadband microwave bulk acoustic delay device would therefore be flat over the broadband.

DESCRIPTION OF THE PREFERRED EMBODIMENTS

Figure 1A:
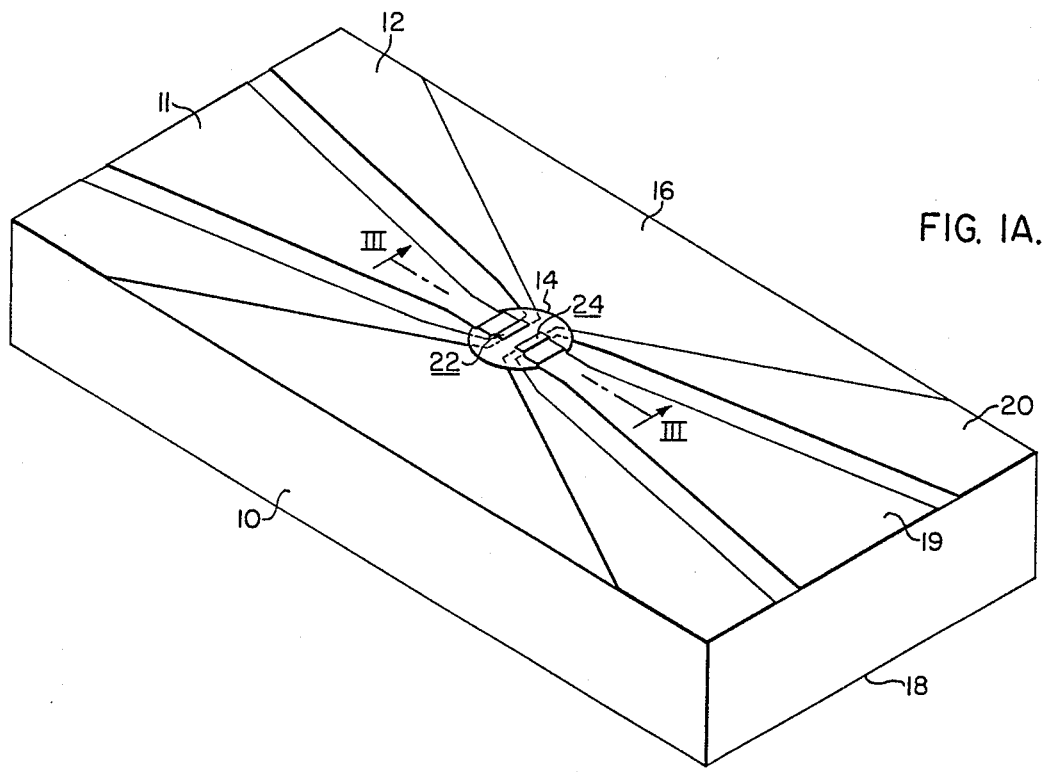
FIG. 1A is an isometric view of an embodiment of the present invention.

Referring now to the drawings, in FIG. 1A a transmission medium 10 is shown suitable for propagating bulk mode ultrasonic elastic wave energy. The transmission medium 10 has a first surface 16 and a second surface 18 spaced from the first surface 16 by the transmission medium. By way of example, materials that would be suitable to implement the transmission medium are materials that are piezoelectric, non-piezoelectric, insulating, semiconductor and conducting. The first surface 16 may be planar suitable for subsequent photolithic steps for fabricating the electrode patterns. The second surface 18 may be planar with all or a portion of the second surface 18 suitable for reflecting ultrasonic elastic wave energy.

A first transducer 22 located on the first surface 16 of the transmission medium 10 is capable of generating and propagating bulk mode ultrasonic elastic wave energy into the transmission medium towards the second surface 18. The first transducer, suitable for operation in the frequency range from 2.6 gigahertz to 6 gigahertz, may be fabricated using vapor deposition techniques. For example, in fabricating a transducer in electrode 12 is deposited on the transmission medium and a piezoelectric material 14, such as zinc oxide or cadmium sulfide or other suitable transducer material, may be vacuum-deposited over the electrode 12. The piezoelectric material is deposited to a thickness of about ⅓ to ½ wavelength of the midband frequency of the transducer. An electrode 11 is deposited over the piezoelectric material 14 and over electrode 12 in the area where transducer action is desired. The electrode area of the transducer corresponds to the aperture from which ultrasonic elastic waves propagate into the transmission medium 10. The method of depositing piezoelectric transducers may be found in U.S. Pat. No. 3,655,429 issued on Apr. 11, 1972 to John deKlerk and assigned to the present assignee.

The ultrasonic elastic wave energy generated by the first transducer 22 propagates into the transmission medium 10 towards the second surface 18 and is reflected from the second surface 18 back towards the first surface 16. A second transducer 24 is located adjacent to the first transducer 22 and receives the ultrasonic elastic wave reflected from the second surface 18. The second transducer 24 located on the first surface 16 may be fabricated by first depositing an electrode 20 on the first surface 16. A piezoelectric material 14 may be deposited over the first electrode 20, and a second electrode 19 is deposited over the piezoelectric material 14 and over the first electrode 20. The area where electrode 19 coincides with electrode 20 with the piezoelectric material 14 in between comprises the second transducer 24.

Figure 1B:
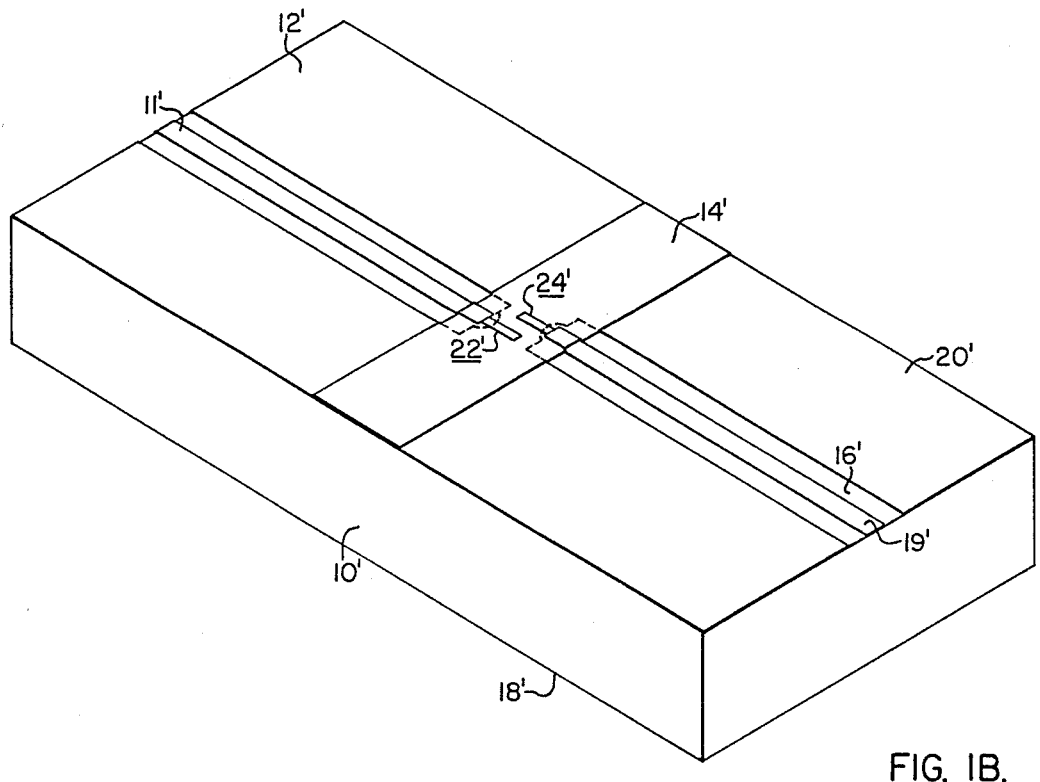
FIG. 1B is an isometric view of an alternate embodiment of the invention.

FIG. 1B is an isometric view of an alternate embodiment of the invention. The components of FIG. 1B are similar to those of FIG. 1A and have been given primed reference numerals. In FIG. 1A the transducers 22 and 24 are in an end-to-end relationship whereas in the arrangement of FIG. 1B the transducers 22' and 24' are in a side-by-side relationship with electrodes 12' and 20' interconnected. The positioning of the microwave input and output means is optional so long as the desired impedance levels and electrical isolation is obtained.

Figure 2:
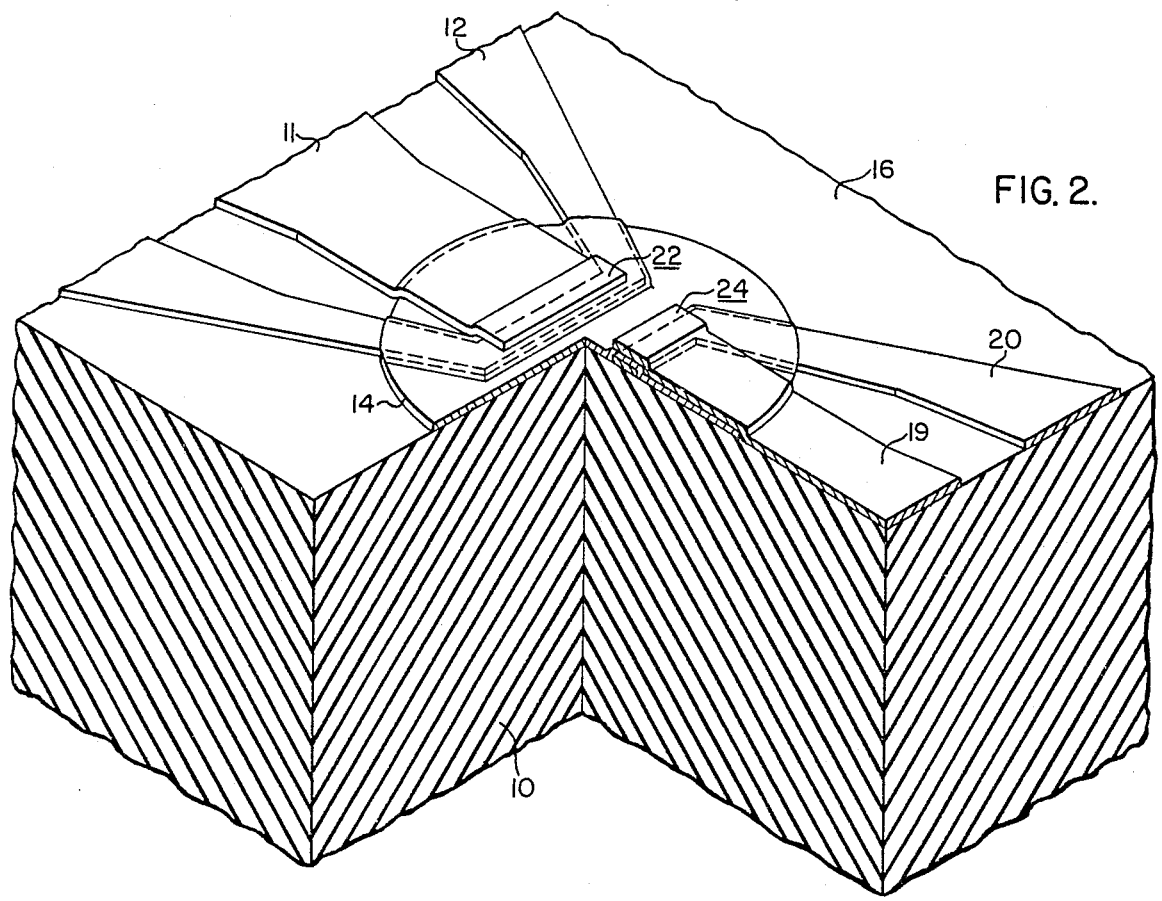
FIG. 2 is an enlarged isometric view with a portion removed of the apparatus of FIG. 1A.

In FIG. 2 an enlarged isometric view with a portion removed of the apparatus of FIG. 1A is shown. FIG. 2 illustrates in better detail the first transducer 22 and the second transducer 24, located on the first surface 16. The electrodes 11, 12, 19 and 20 may be formed with suitable materials, including gold and aluminum and may be vacuum-deposited. Electrodes 11 and 12, as shown in FIG. 1A and FIG. 2, together form a microwave input means to the first transducer 22. The electrodes 19 and 20, as shown in FIGS. 1A and 2, together form the microwave output means from the second transducer 24. The electrodes 11 and 12 are geometrically shaped or tapered to provide a coplanar transmission line with an impedance based on the geometry to match the transducer impedance. The microwave input means may have a predetermined impedance where it connects to the first transducer 22 and another impedance some distance from the transducer 22. A suitable impedance at some distance from the transducer 22 for electrodes 11 and 12 would be 50 ohms for connection to a 50 ohm coaxial input lead. The output means comprising electrodes 19 and 20 connecting to the second transducer 24 are shown in FIGS. 1A and 2 to be geometrically shaped or tapered to form a coplanar transmission line to match the impedance of the second transducer 24. The impedance may vary along the coplanar transmission line and at some distance from the second transducer 24 the characteristic impedance of electrodes 19 and 20 may be 50 ohms, which would be suitable for connection to a 50 ohm coaxial output lead. In an alternate embodiment, electrode 12 is connected to electrode 20 as a common ground line or ground plane on the first surface 16. FIGS. 1A and 2 show electrodes 12 and 20 as separate electrodes to decrease coupling and to provide more isolation between the input signal and the output signal. Since electrodes 12 and 20 are separate, eddy currents, ground currents and capacitance currents are inhibited.

Figure 3:
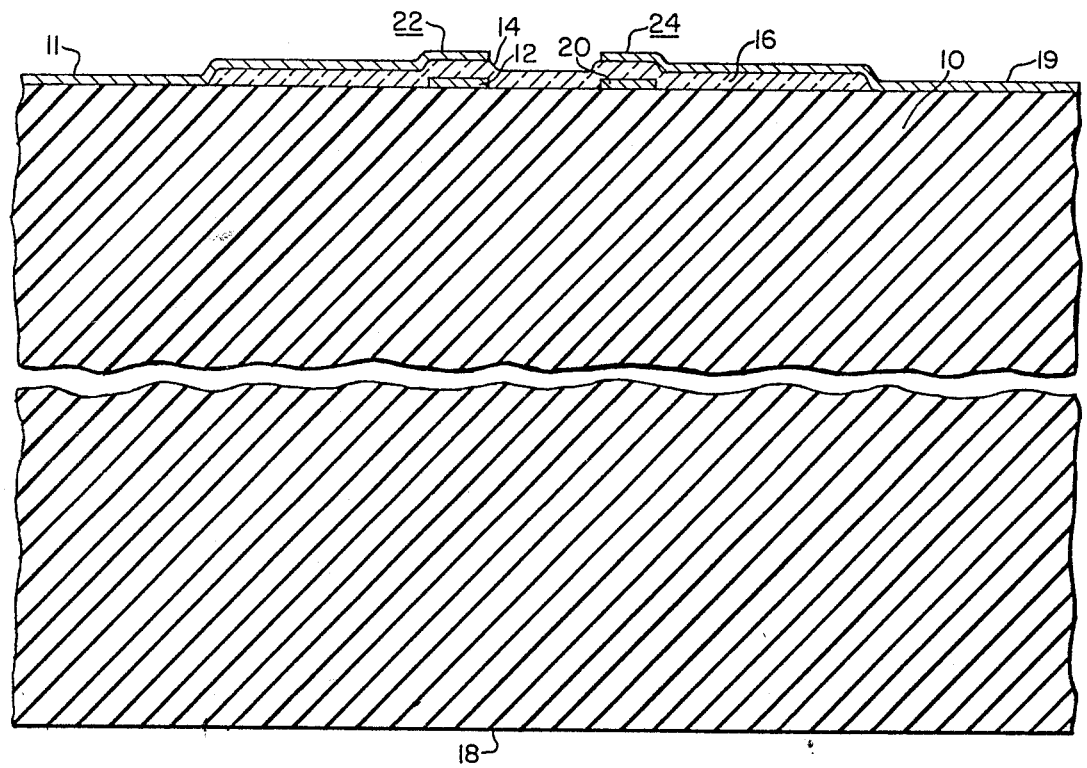
FIG. 3 is an enlarged sectional view of the apparatus taken along lines III—III of FIG. 1A.

FIG. 3 shows a cross-sectional view along lines III—III of the invention shown in FIG. 1A. An ultrasonic elastic wave from the first transducer travels towards the second surface 18 and is reflected by the second surface 18 upwards in the direction towards the first surface. The second transducer 24 is in the area incident of the reflected wave on the first surface. The aperture or sound emitting area of the first transducer 22 corresponds with the dimensions of the coincidence of the electrode 11 over top of electrode 12 with piezoelectric material 14 in between.

Figure 4:
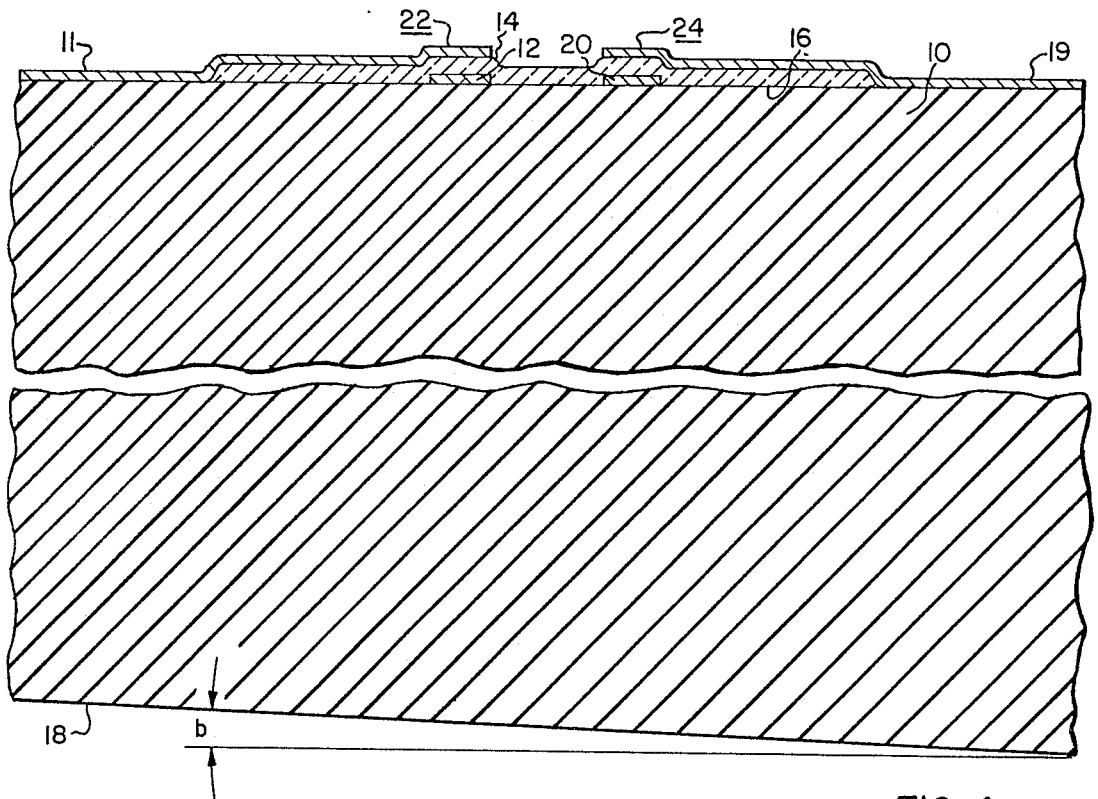
FIG. 4 is an enlarged sectional view of an alternative embodiment of the invention.

FIG. 4 shows an alternate embodiment of the invention, with a second surface 18' being at an acute angle b with respect to the first surface to direct the reflection of bulk ultrasonic elastic wave energy towards the area of the second transducer 24.

Figure 5:
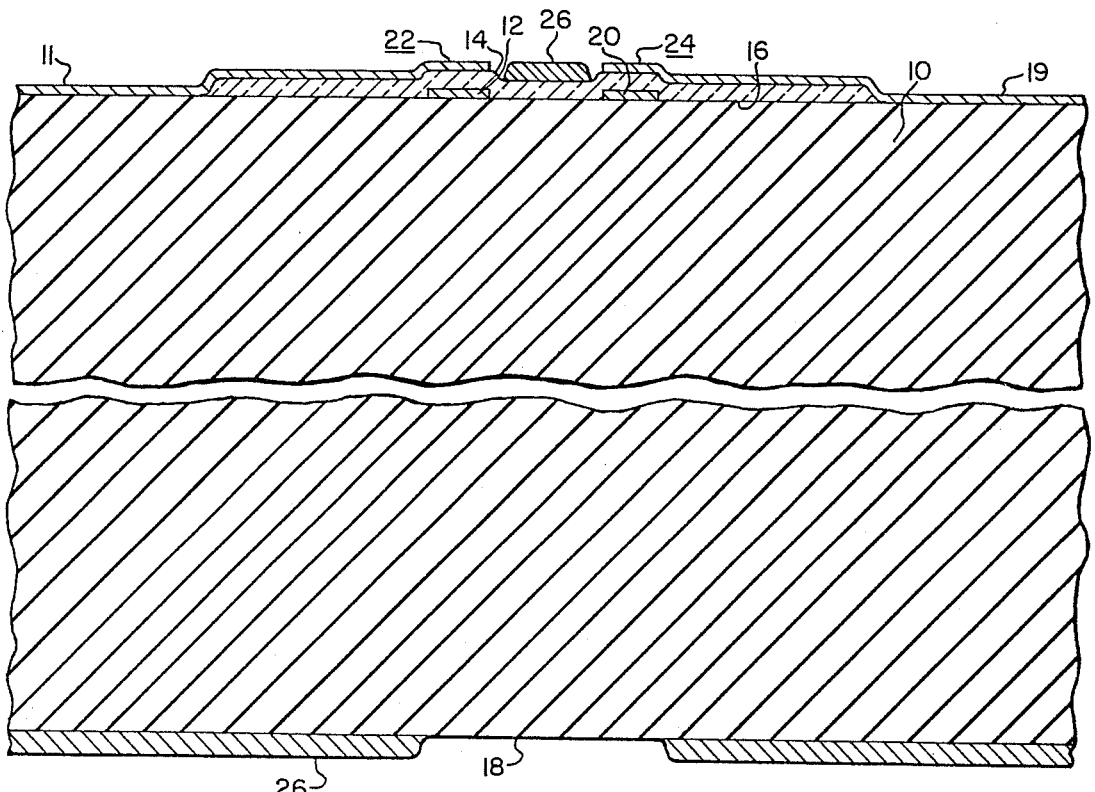
FIG. 5 is an enlarged sectional view of an alternative embodiment of the invention.

FIG. 5 is a cross-sectional view as in FIG. 3, and further includes acoustic absorbing material 26 located on the second surface 18. The acoustic absorbing material should be several wavelengths thick in order to absorb the ultrasonic elastic wave energy. The acoustic radiation impedance of the transmission medium should be matched by the material selected for the acoustic absorbing material. If the acoustic radiation impedance is matched fairly closely, the ultrasonic elastic wave energy will propagate into the acoustic absorbing material. The acoustic radiation impedance of the transmission medium and the acoustical absorbing material may be matched by selecting materials which exhibit an equal or near-equal $\rho V$ product, where $\rho$ is equal to the density of the material and $V$ is equal to the velocity of ultrasonic elastic wave energy in the material. Materials that would be suitable as acoustical absorbing material, when the transmission medium is silicon, include indium and lead. Additionally, acoustical absorbing material may be selectively deposited on the first surface 16 on conductors 11, 12, 19 and 20 and on the piezoelectric material 14 in the areas in close proximity to the first and second transducers.

The characteristics of an ultrasonic elastic wave as it propagates through a transmission medium are determined by the size of the aperture of the transducer utilized and by the velocity of ultrasonic elastic waves in the transmission medium.

Figure 6:
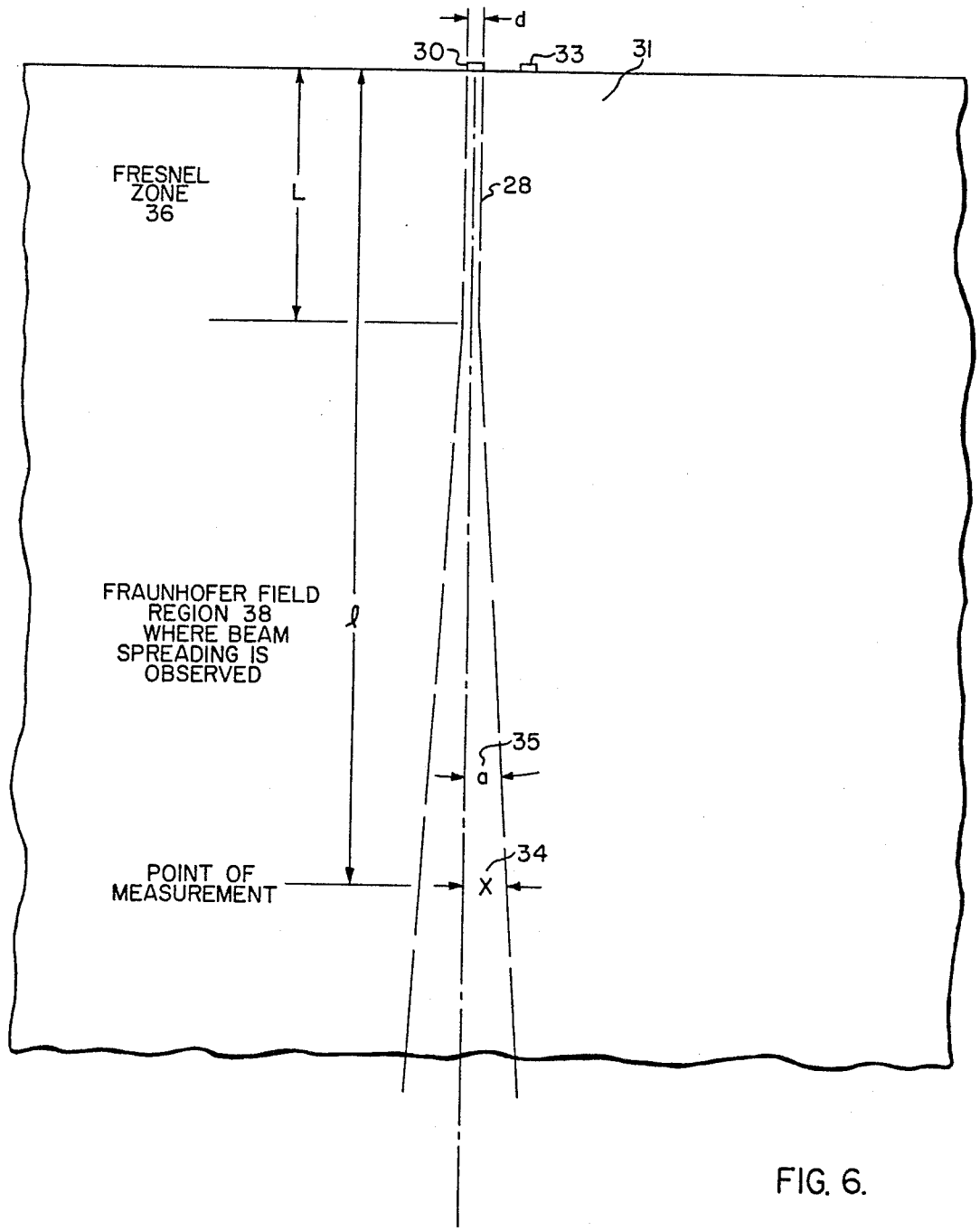
FIG. 6 is a diagram of ultrasonic elastic wave behavior in a transmission medium.

Referring now to FIG. 6, a transducer 30 is shown on a surface of a transmission medium 31 for propagating an ultrasonic elastic wave 28. The ultrasonic elastic wave, upon entering the transmission medium, exhibits characteristics as determined by laws of physics wherein the initial path is known as the Fresnel zone. In the Fresnel zone the ultrasonic elastic wave continues with approximately the same cross-sectional area as the original aperture. At the end of the Fresnel zone, the ultrasonic elastic wave begins to spread, forming a larger cross-sectional area as it propagates through the transmission medium 31. The region where beam spreading begins and continues at a constant rate is called the Fraunhofer field region. The Fresnel zone extends from the transducer 30 approximately out to a distance $L$ where:

$$L = 2d^2/\lambda \tag{1}$$

where $d$ is the length of one side of the transducer for a rectangular transducer and $\lambda$ is the wavelength of the ultrasonic elastic wave in the transmission medium. $\lambda$ may be determined by the relationship:

$$\lambda = v/f \tag{2}$$

where $v$ is the velocity of the ultrasonic elastic wave in the transmission medium and $f$ is the frequency of the ultrasonic elastic wave. For silicon the velocity of the ultrasonic elastic wave is $9 \times 10^5$ cm/sec. The Fraunhofer field region is considered to begin where the Fresnel zone ends. The beam spreading of the ultrasonic elastic wave in the Fraunhofer field region is described by the angle $\alpha$, as shown in FIG. 6 and is defined by the relationship:

$$\sin \alpha = \lambda/2d \tag{3}$$

The distance $x$ from the beam center out to the beam edge in the Fraunhofer region is:

$$x = l \tan \alpha \tag{4}$$

where $l$ is the distance from the transducer to the point of measurement in the Fraunhofer field region. The beam spreading in the Fraunhofer field region continues uniformly as the ultrasonic elastic wave travels through the transmission medium.

If a reflecting medium is interposed in the path of the beam in the Fraunhofer region, the reflected beam will also continue spreading at the same angle $\alpha$. In the present invention the reflecting medium is the interface of the second surface and to this end reference is made to FIGS. 7A–7D.

FIGS. 7A–7D illustrate a cross-sectional view as in FIG. 3 and additionally shows the propagation and reflection of an ultrasonic elastic wave 32.

By way of example, typical parameters may be:

| | |
|---|---|
| Frequency of input signal | 5.2 GHz |
| Transmission medium | Silicon |
| $\lambda$ in transmission medium | $1.73 \times 10^{-4}$ cm |
| d of transducers 22 and 24 | $1.27 \times 10^{-3}$ cm |
| distance between transducers | $2.54 \times 10^{-3}$ cm |
| thickness T of transmission medium | $4.5 \times 10^{-2}$ cm |

With these parameters the Fraunhofer field region begins at a distance of approximately $1.86 \times 10^{-2}$ cm from the first surface and the beam spreading angle $\alpha$ would be approximately 3° 54 min.

Figure 7A:
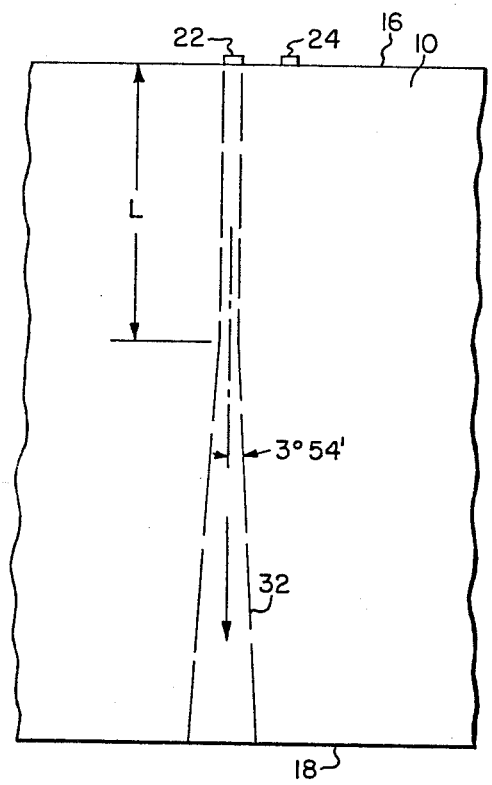
FIGS. 7A–7D illustrate the path of an ultrasonic elastic wave from a first transducer to a second transducer arranged as in FIG. 1A and subsequent reflections showing beam spreading in the Fraunhofer field region.
Figure 7B:
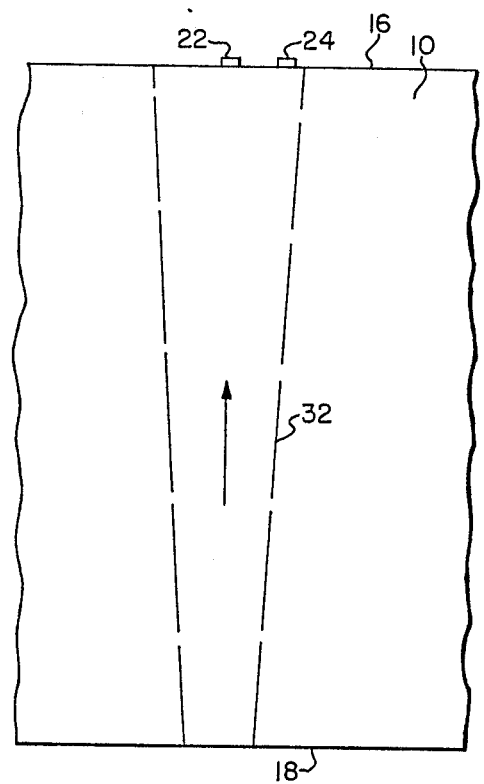
Figure 7C:
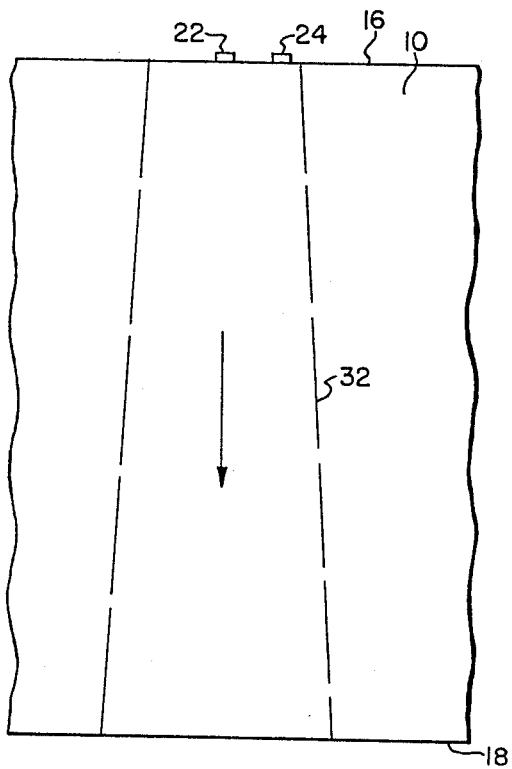
Figure 7D:
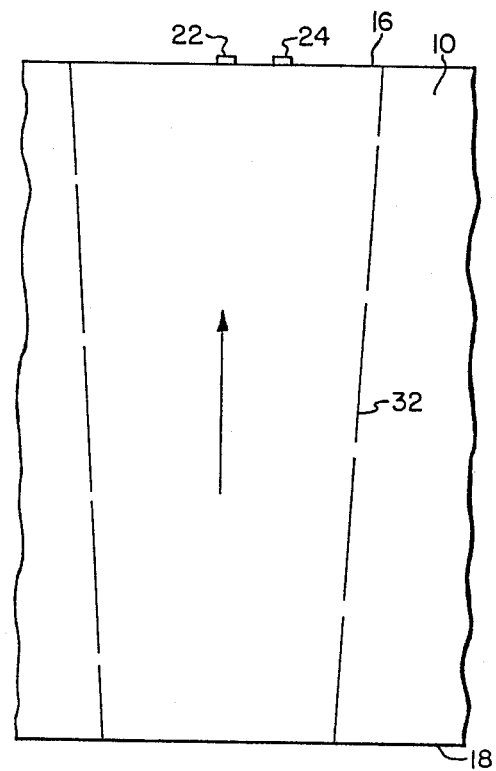

The ultrasonic elastic wave 32 is generated by transducer 22 (illustrated simply as a block) located on the first surface 16 and propagates into the transmission medium 10. The propagation characteristics initially are those of an ultrasonic elastic wave in the Fresnel zone and the wave will continue propagating with the same beam width until the Fraunhofer field region is reached as shown in FIG. 7A, at which point beam spreading begins. When the ultrasonic elastic wave energy impinges upon the second surface 18, which for this embodiment is parallel to the first surface 16, the ultrasonic elastic wave is reflected back in the the opposite direction towards the first surface 16 as illustrated in FIG. 7B. The wave traveling from the second surface to the first surface is the first reflected ultrasonic elastic wave. This first reflected ultrasonic elastic wave will continue to diverge at the angle $\alpha$. When the first reflected wave impinges upon the first surface, as shown in FIG. 7B, the second transducer 24 will absorb (as will the first transducer 22) some of the energy which will be converted into the microwave energy. The remaining ultrasonic elastic wave energy which is not absorbed by the first and second transducers will be reflected back to the second surface 18, as shown in FIG. 7C as the second reflected ultrasonic elastic wave. The second reflected ultrasonic elastic wave will continue to exhibit beam spreading at the same angle $\alpha$. When the second reflected ultrasonic elastic wave impinges upon the second surface 18, the wave will be reflected back towards the first surface 16 as the third reflected ultrasonic wave as illustrated in FIG. 7D and still exhibiting the same divergence at angle $\alpha$. When the wave again impinges upon the first surface 16, some ultrasonic elastic wave energy will again be absorbed by transducer 24 (and transducer 22) and converted into microwave energy. The energy of the third reflected wave per unit area will be diminished as the wave is absorbed by the transducers, by propagation loss and by the continuing spreading of the wave at the angle $\alpha$ over a larger area. The ultrasonic elastic wave will continue to be reflected between the first surface 16 and the second surface 18 with the beam spreading at angle α until it is dissipated through absorption or losses.

Figure 8A:
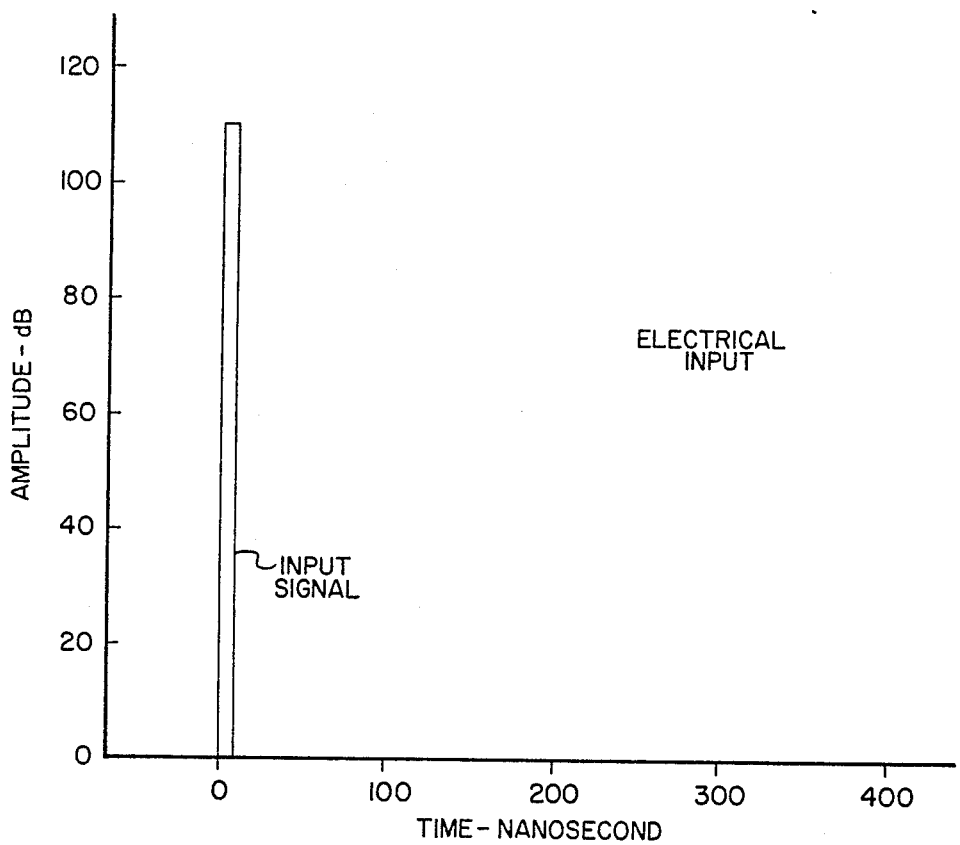
FIGS. 8A and 8B are graphs showing the electrical signals at the microwave input and output means as a function of time after an input signal is applied to the input means.
Figure 8B:
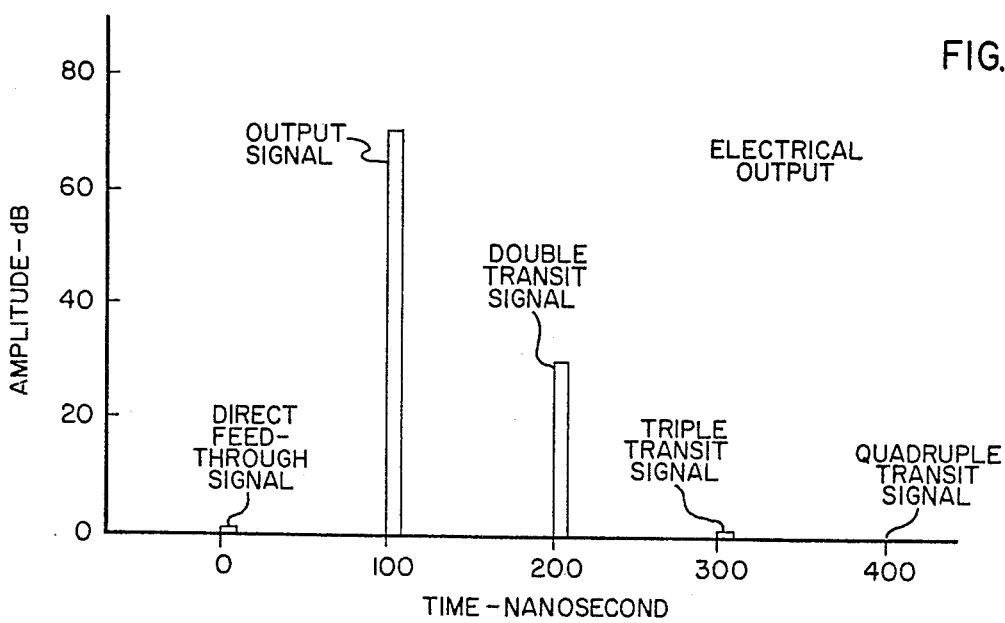

The electrical input and output signals for the operation as depicted in FIGS. 7A–7D are illustrated in FIGS. 8A and 8B. An input signal of microwave energy is applied to the microwave input means (FIG. 1A). Due to capacitive and inductive coupling, a certain amount of microwave energy will appear at the microwave output means. The signal at the microwave output means due to this coupling is termed the direct feedthrough signal. In an embodiment as shown in FIG. 1A, where the microwave input and output means are coplanar transmission lines, a typical value for the direct feedthrough signal is approximately 100–120 db decibel below the input signal. Decibels are a measure of power ratios where the power ratio in decibels is equal to 10 times the logarithm to the base 10 of the power ratio.

The microwave input energy is converted into an ultrasonic elastic wave and after reflection back to the first surface 16 the second transducer 24 will provide an output signal as shown in FIG. 8B. The time delay between the input signal and the output signal is due to the time required for the ultrasonic elastic wave to propagate through the transmission medium 10 from the first surface 16 to the second surface 18 and back to the first surface 16. The first transducer 22 also receives ultrasonic elastic wave energy and converts some of this energy into microwave energy. A typical output signal for the embodiment as shown in FIG. 1A with a 100 nanosecond time delay is in the range of 30–40 db below the input signal. The power ratio in decibels between the microwave input signal and the microwave output signal is known as the insertion loss.

The ultrasonic elastic wave impinging on the first surface 16 creating the output signal is reflected towards the second surface 18 and is reflected by surface 18 back towards surface 16, as shown in FIGS. 7C and 7D. When the reflected ultrasonic elastic wave again impinges on surface 16, the second transducer 24 again provides an electrical output indicated as the double transit signal shown in FIG. 8B. The amplitude of the double transit signal is less than that of the output signal, due to losses arising from the wave propagating through the transmission medium, losses due to the ultrasonic elastic wave spreading as it propagates through the transmission medium and due to absorption by acoustical absorbing material if it has been applied to the surface, as shown in FIG. 5.

Subsequent reflected ultrasonic elastic wave energy impinging upon the first surface 16 will generate a microwave output considerably smaller than the double transit signal due to additional absorption and losses as shown in FIG. 8B and may appear as a triple transit signal and quadruple transit signal, respectively. Each time the ultrasonic elastic wave is reflected from the first and second surfaces, the wave will continue to spread and the wave will continue to lose energy per unit area.

Figure 10:
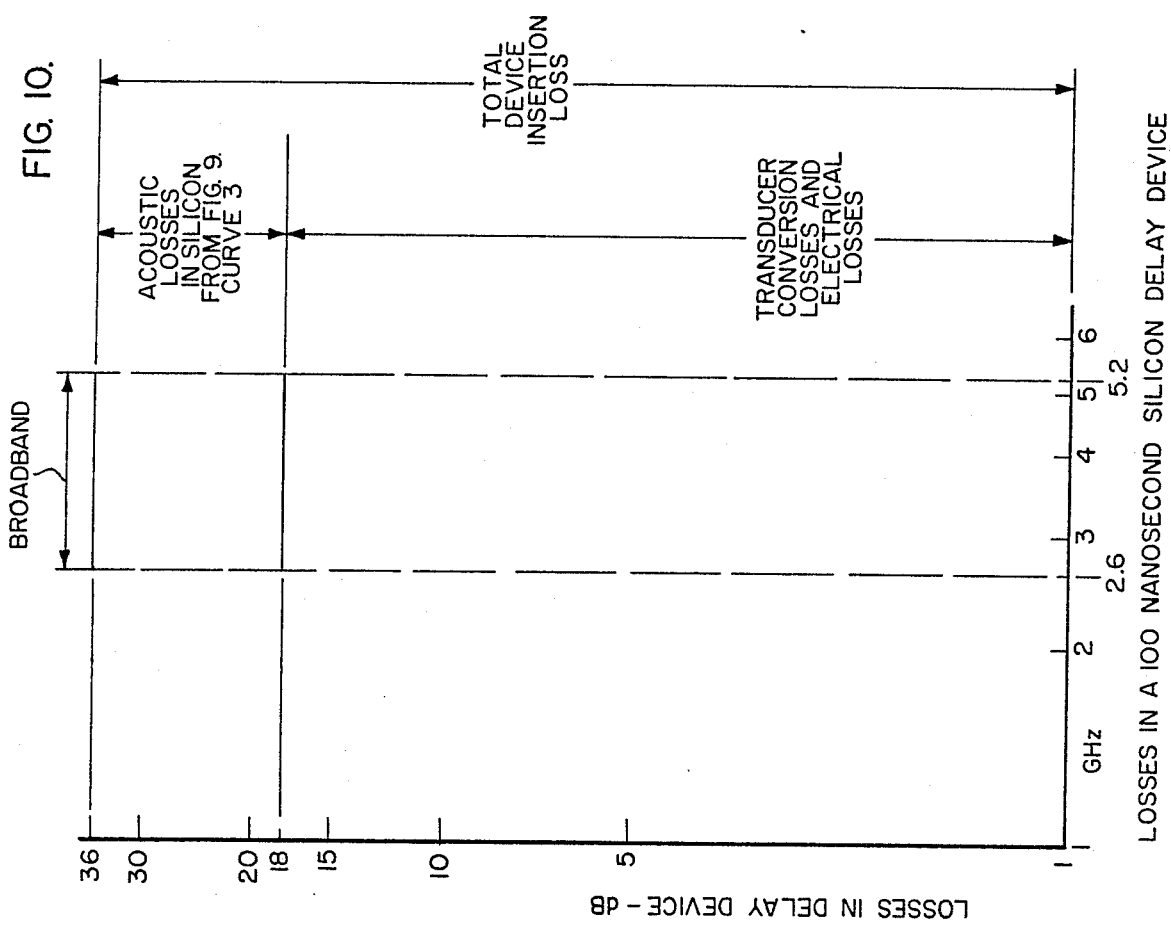
FIG. 10 is a graph showing the sum of typical losses in a 100 nanosecond silicon broadband microwave bulk acoustic delay device as a function of frequency.
Figure 9:
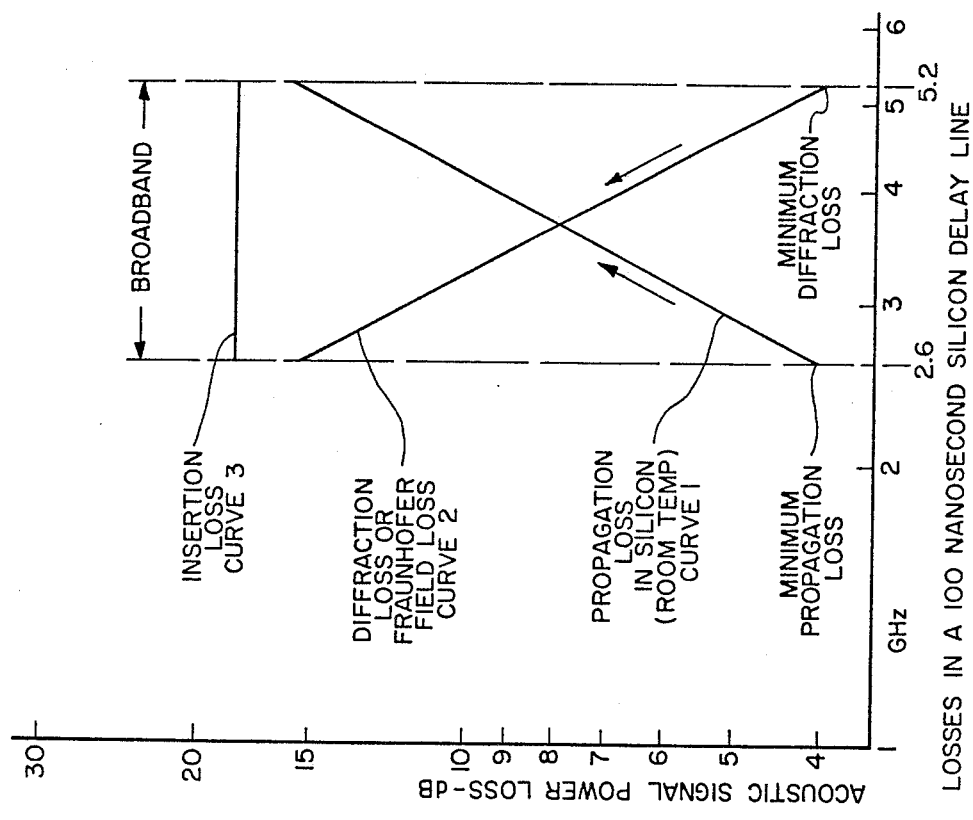
FIG. 9 is a graph showing typical losses in a 100 nanosecond silicon broadband microwave bulk acoustic delay device as a function of frequency.

The invention as shown in FIG. 1A may be constructed to provide a broadband delay device with a flat band insertion loss from a frequency of, for example, 2.6 gigahertz to 5.2 gigahertz. An ultrasonic elastic wave, as it propagates through a transmission medium such as silicon, will exhibit a loss of energy (propagation loss). This loss of energy is proportional to the frequency squared, as represented by curve 1 of FIG. 9, and is determined by the material selected and the time delay required. The ultrasonic elastic wave, as it propagates through the transmission medium such as silicon in the Fraunhofer field region, will exhibit an energy per unit area loss (diffraction loss) inversely proportional to the frequency squared, as shown by curve 2 of FIG. 9 and is determined by the material selected and the operative dimension $d$. If the minimum propagation loss at 2.6 gigahertz is used as a value to determine the minimum diffraction loss at 5.2 gigahertz, the resultant insertion loss as a function of frequency will be relatively flat from 2.6 gigahertz to 5.2 gigahertz, as illustrated by curve 3 of FIG. 9. In addition to acoustic losses of energy in the ultrasonic elastic wave in the transmission medium, additional electromechanical conversion losses are exhibited in the transducer and further, smaller electrical losses are exhibited in the microwave input means. The conversion and electrical losses lumped together are about 18 db and are relatively flat over the band from 2.6 gigahertz to 5.2 gigahertz. The resulting microwave delay device, therefore, exhibits a flat band characteristic from 2.6 to 5.2 gigahertz and a total insertion loss of less than 40 db over the flat band as shown in FIG. 10.

What is claimed is:

1. Electroacoustic apparatus comprising:
    an ultrasonic transmission medium having a first and second surface,
    first and second transducers adapted to convert microwave energy into bulk mode ultrasonic elastic wave energy, and vice versa, deposited on said first surface,
    microwave input means connected to said first transducer,
    microwave output means connected to said second transducer,
    said first transducer and ultrasonic transmission medium adapted for propagation of bulk mode ultrasonic elastic wave energy in said ultrasonic transmission medium,
    said second surface being planar and positioned to reflect ultrasonic elastic wave energy incident upon said second surface,
    said second transducer located within the area incident of a first reflected ultrasonic elastic wave from said second surface,
    said first transducer electrode dimensions being of such size to provide a predetermined diffraction loss at said second transducer for said first reflected ultrasonic elastic wave.

2. The apparatus as defined by claim 1 wherein said first and second surfaces are parallel.

3. The apparatus as defined by claim 1 wherein said first and second surface are at an acute angle.

4. Electroacoustic apparatus comprising:
    an ultrasonic transmission medium having a first and second surface,
    first and second transducers adapted to convert microwave energy into bulk mode ultrasonic elastic wave energy, and vice versa, located on said first surface,
    microwave input means connected to said first transducer,
    microwave output means connected to said second transducer,
    said first transducer and ultrasonic transmission medium adapted for propagation of bulk mode ultrasonic elastic wave energy in said ultrasonic transmission medium, said second surface being positioned to reflect ultrasonic elastic wave energy incident upon said second surface, said second transducer located within the area incident of a first reflected ultrasonic elastic wave from said second surface, said first reflected ultrasonic elastic wave incident upon said first surface being spread over a larger area than the area of the initially propagated ultrasonic elastic wave due to propagation in the Fraunhofer field region wherein said microwave input means is a coplanar transmission line.

5. The apparatus as defined by claim 4 wherein the impedance of said coplanar transmission line is a function of the distance from said first transducer.

6. Electroacoustic apparatus comprising:

an ultrasonic transmission medium having a first and second surface, first and second transducers adapted to convert microwave energy into bulk mode ultrasonic elastic wave energy, and vice versa, located on said first surface, microwave input means connected to said first transducer, microwave output means connected to said second transducer, said first transducer and ultrasonic transmission medium adapted for propagation of bulk mode ultrasonic elastic wave energy in said ultrasonic transmission medium, said second surface being positioned to reflect ultrasonic elastic wave energy incident upon said second surface, said second transducer located within the area incident of a first reflected ultrasonic elastic wave from said second surface, said first reflected ultrasonic elastic wave incident upon said first surface being spread over a larger area than the area of the initially propagated ultrasonic elastic wave due to propagation in the Fraunhofer field region wherein said microwave output means is a coplanar transmission line.

7. The apparatus as defined by claim 6 wherein the impedance of said coplanar transmission line is a function of the distance from said second transducer.

8. The apparatus as defined by claim 1 wherein said ultrasonic transmission medium is non-piezoelectric.

9. The apparatus as defined by claim 8 wherein said ultrasonic transmission medium is semi-insulating silicon.

10. The apparatus as defined by claim 1 wherein said ultrasonic transmission medium is piezoelectric.

11. The apparatus as defined by claim 1 wherein said first and second transducers are each fabricated by a first electrode deposited onto said ultrasonic transmission medium, a piezoelectric material deposited to a desired thickness on said first electrode and a second electrode deposited upon said piezoelectric material above the first electrode.

12. The apparatus as defined by claim 11 wherein said piezoelectric material is deposited simultaneously for both said first and second transducers.

13. The apparatus as defined by claim 12 wherein said piezoelectric material is a continuous film between said first and second transducers.

14. The apparatus as defined by claim 1 wherein a layer of acoustical absorbing material is selectively deposited on said second surface to attenuate a portion of first and subsequent reflected ultrasonic elastic waves.

15. The apparatus as defined by claim 14 wherein said layer of acoustical absorbing material includes the element indium.

16. The apparatus as defined by claim 1 wherein a layer of acoustic absorbing material is selectively deposited on said first surface to attenuate a portion of ultrasonic elastic waves reflected from said first surface.

17. The apparatus as defined by claim 16 wherein said layer of acoustical absorbing material includes the element indium.

18. Electroacoustic apparatus comprising:

an ultrasonic transmission medium having a first and second surface, first and second transducers adapted to convert microwave energy into bulk mode ultrasonic elastic wave energy, and vice versa, located on said first surface, microwave input means connected to said first transducer, microwave output means connected to said second transducer, said first transducer and ultrasonic transmission medium adapted for propagation of bulk mode ultrasonic elastic wave energy in said ultrasonic transmission medium, said second surface being positioned to reflect ultrasonic elastic wave energy incident upon said second surface, said second transducer located within the area incident of a first reflected ultrasonic elastic wave from said second surface, said first reflected ultrasonic elastic wave incident upon said first surface being spread over a larger area than the area of the initially propagated ultrasonic elastic wave due to propagation in the Fraunhofer field region wherein the first transducer electrode dimensions are adjusted in size to provide a diffraction loss at the highest frequency of a desired broadband which is equal to the minimum propagation loss at the lowest frequency of said desired broadband whereby the insertion loss of the apparatus is relatively constant from the said lowest frequency to the said highest frequency.

19. The apparatus as defined by claim 1 wherein said first and second transducers have an electromechanical conversion loss characteristic, said ultrasonic transmission medium has an ultrasonic elastic wave propagation loss characteristic, and said diffraction loss, said electromechanical conversion loss and said propagation loss being combined to provide a predetermined insertion loss through the apparatus.

* * * * *

UNITED STATES PATENT AND TRADEMARK OFFICE
CERTIFICATE OF CORRECTION

PATENT NO. : 3 952 139
DATED : April 20, 1976
INVENTOR(S) : Peter Bürkle et al

It is certified that error appears in the above-identified patent and that said Letters Patent are hereby corrected as shown below:

Column 4, line 17, change "35" to --25--.

Signed and Sealed this

Twenty-eighth Day of September 1976

[SEAL]

Attest:

RUTH C. MASON
*Attesting Officer*

C. MARSHALL DANN
*Commissioner of Patents and Trademarks*